US012690486B2

(12) United States Patent
Pok et al.

(10) Patent No.: US 12,690,486 B2
(45) Date of Patent: Jul. 21, 2026

(54) SUBTRACTIVE METAL STRUCTURING ON SURFACE OF SEMICONDUCTOR PACKAGE

(71) Applicant: Infineon Technologies AG, Neubiberg (DE)

(72) Inventors: Pei Luan Pok, Melaka (MY); Swee Kah Lee, Melaka (MY); Soon Lock Goh, Malacca (MY); Chee Hong Lee, Paya Rumput (MY); Samsun Paing, Tangkak (MY); Chee Chiew Chong, Batu Caves (MY)

(73) Assignee: Infineon Technologies AG, Neubiberg (DE)

( * ) Notice: Subject to any disclaimer, the term of this patent is extended or adjusted under 35 U.S.C. 154(b) by 520 days.

(21) Appl. No.: 18/122,776

(22) Filed: Mar. 17, 2023

(65) Prior Publication Data

US 2024/0312956 A1 Sep. 19, 2024

(51) Int. Cl.
*H10W 74/01* (2026.01)
*H10W 70/04* (2026.01)
*H10W 72/00* (2026.01)

(52) U.S. Cl.
CPC ......... *H10W 74/019* (2026.01); *H10W 70/04* (2026.01); *H10W 74/014* (2026.01); *H10W 72/012* (2026.01); *H10W 72/0198* (2026.01)

(58) Field of Classification Search
None
See application file for complete search history.

(56) References Cited

U.S. PATENT DOCUMENTS

| | | | |
|---|---|---|---|
| 2009/0160053 A1* | 6/2009 | Meyer | H01L 21/568 257/E23.141 |
| 2020/0185293 A1* | 6/2020 | Schmalzl | H01L 21/4846 |
| 2020/0321269 A1 | 10/2020 | Chiang et al. | |
| 2021/0111108 A1* | 4/2021 | Singer | H01L 23/49524 |
| 2021/0305203 A1 | 9/2021 | Graziosi et al. | |

FOREIGN PATENT DOCUMENTS

| | | |
|---|---|---|
| CN | 101930958 A | 12/2010 |
| DE | 102008063633 A1 | 7/2009 |
| DE | 102011054377 A1 | 4/2012 |
| DE | 102021113069 A1 | 11/2021 |
| WO | 2017045422 A1 | 3/2017 |

* cited by examiner

*Primary Examiner* — Jay C Chang
(74) *Attorney, Agent, or Firm* — Murphy, Bilak & Homiller, PLLC

(57) ABSTRACT

A method of forming a semiconductor package includes providing a baseplate, mounting a semiconductor die on the baseplate with a main surface of the semiconductor die facing away from the baseplate, forming vertical interconnect elements on the main surface of the semiconductor die, forming an encapsulant on the baseplate that encapsulates the semiconductor die, exposing the vertical interconnect elements at an upper surface of the encapsulant, forming a first level metal pad on the upper surface of the encapsulant that contacts the exposed vertical interconnect elements, and forming structured metal regions on the upper surface of the encapsulant, wherein forming the structured metal regions includes structuring the first level metal pad.

18 Claims, 7 Drawing Sheets

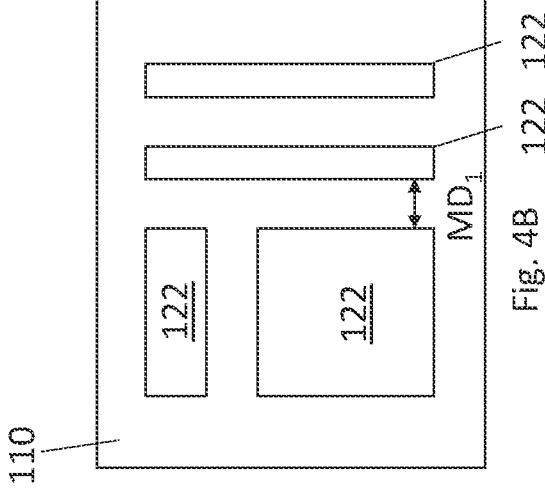
Fig. 4B
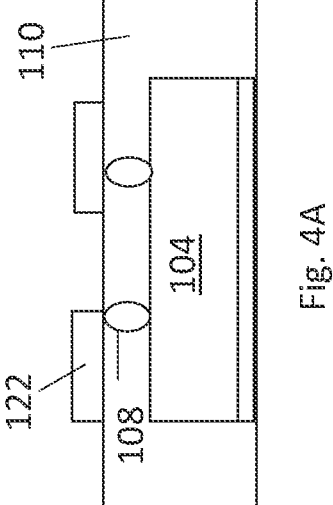
Fig. 4A
FIGURE 4

SUBTRACTIVE METAL STRUCTURING ON SURFACE OF SEMICONDUCTOR PACKAGE

TECHNICAL FIELD

The instant application relates to semiconductor devices, and in particular relates to methods of forming semiconductor packages and corresponding semiconductor packages.

BACKGROUND

Many types of semiconductor devices are highly sensitive to parasitic electrical effects such as parasitic interconnect resistance and inductance, parasitic capacitive coupling, etc. For example, switches, RF (radio frequency) power amplifiers, low-noise amplifiers (LNAs), antenna tuners, mixers, etc. are each highly sensitive to parasitic electrical effects. Techniques for reducing parasitic electrical effects on a packaged semiconductor device often result in higher overall cost, larger package size, more complex manufacturing process, reduced device performance, etc.

SUMMARY

A method of forming a semiconductor package is disclosed. According to an embodiment, the method comprises providing a baseplate, mounting a semiconductor die on the baseplate with a main surface of the semiconductor die facing away from the baseplate, forming vertical interconnect elements on the main surface of the semiconductor die, forming an encapsulant on the baseplate that encapsulates the semiconductor die, exposing the vertical interconnect elements at an upper surface of the encapsulant, forming a first level metal pad on the upper surface of the encapsulant that contacts the exposed vertical interconnect elements, and forming structured metal regions on the upper surface of the encapsulant, wherein forming the structured metal regions comprises structuring the first level metal pad.

A method of forming a plurality of semiconductor packages is disclosed. According to an embodiment, the method comprises providing a baseplate, mounting a plurality of semiconductor dies on the baseplate with a main surface of each of the semiconductor dies facing away from the baseplate, forming vertical interconnect elements on the main surfaces of each of the semiconductor dies, forming an encapsulant on the baseplate that encapsulates each of the semiconductor dies, exposing the vertical interconnect elements from each of the semiconductor dies at an upper surface of the encapsulant, forming a first level metal pad on the upper surface of the encapsulant that contacts the exposed vertical interconnect elements from each of the semiconductor dies, and forming structured metal regions on the upper surface of the encapsulant, and dicing the encapsulant to form the plurality of semiconductor packages, wherein each of the semiconductor packages comprises at least one of the semiconductor dies and a group of the structured metal regions forming connections with the at least one of the semiconductor dies, wherein forming the structured metal regions comprises structuring the first level metal pad.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1, which includes

FIG. 2, which includes

FIG. 4, which includes FIGS. 4A and 4B, illustrate a semiconductor package, according to an embodiment. FIG. 4A illustrates a side-view of the semiconductor package; and FIG. 4B illustrates a plan-view of the semiconductor package.

DETAILED DESCRIPTION

Embodiments of a method of forming a semiconductor package to comprise structured metal regions on an upper surface of the package body are described herein. The method comprises forming a first level metal pad on the upper surface of encapsulant material and forming a second level metal on the first level metal pad. The second level metal may be formed by an electroplating technique, wherein the first level metal pad is used as a thin seed layer. The first level metal pad may be biased from a baseplate that is connected to the first level metal pad by electrically conductive pillars. After formation of the second level metal a masked etching process that structures at least the first level metal pad and, depending on how the second level metal is formed, may structure the second level metal as well. The method advantageously allows for the formation of thick and hence low-resistance structured metal features directly on the upper surface of the package body. Moreover, by using a subtractive process whereby a blanket layer of metallization comprising at least the first level metal pad is patterned using photolithographic techniques, an advantageously higher resolution can be obtained comparison to direct structuring techniques such as laser direct structuring techniques.

Figures 1A, 1B, 1C:
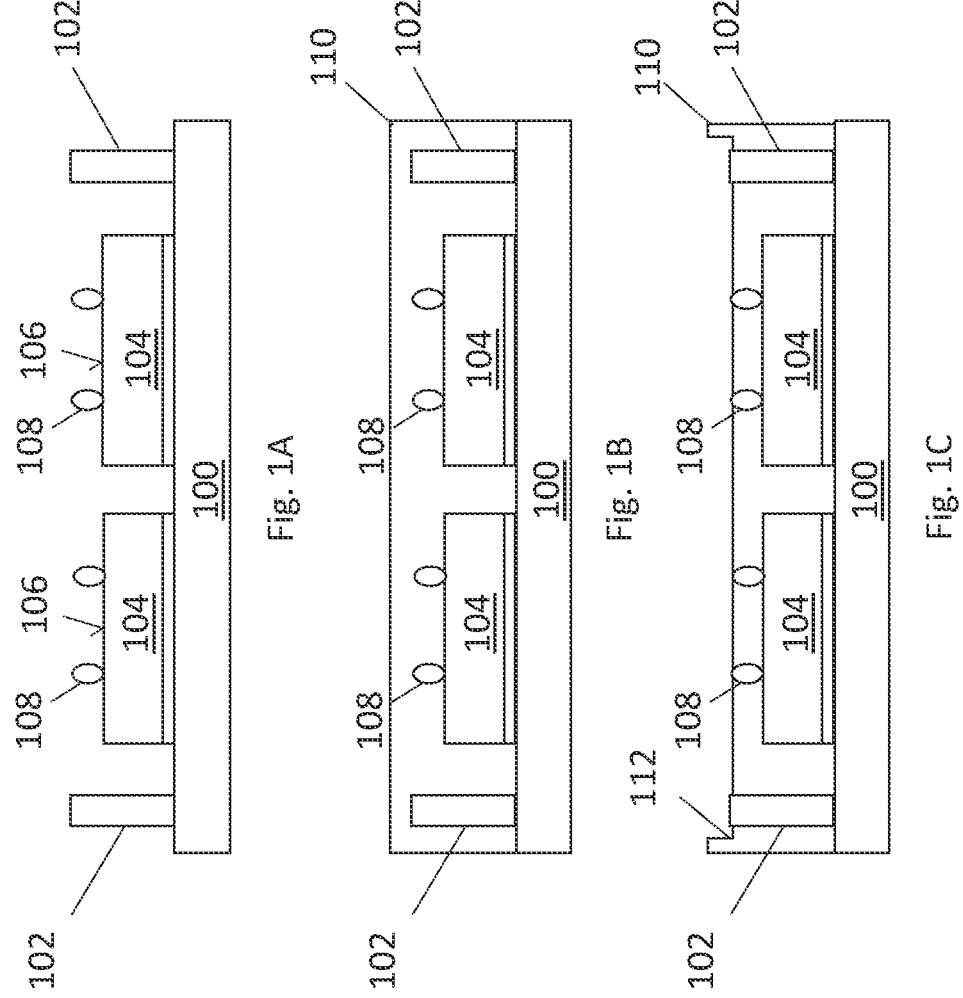
FIGS. 1A-1I, illustrates selected steps in a method of forming a semiconductor package, according to an embodiment.

Referring to FIG. 1A, a baseplate 100 is provided. The baseplate 100 may be an electrically conductive structure. For example, the baseplate 100 may be formed from a metal sheet of copper, aluminum, alloys thereof, etc. In other embodiments, the baseplate 100 may comprise electrically insulating regions and be configured for electrical routing with the conductive pillars 102. For example, the baseplate 100 may be a circuit carrier comprising an insulating core of laminate material, ceramic, etc., e.g., a PCB (printed circuit board), IMS (insulated metal substrate), AMB (active metal brazed) substrate, etc.

Electrically conductive pillars 102 are provided on the baseplate 100. The baseplate 100 is configured to form an electrically conductive connection with the electrically conductive pillars 102 so as to conduct electrical current in an electroplating process to be described below. The baseplate 100 and/or the electrically conductive pillars 102 may be comprise or are plated with any or more of Cu, Ni, Ag, Au, Pd, Pt, NiV, NiP, NiNiP, NiP/Pd, Ni/Au, NiP/Pd/Au, or NiP/Pd/AuAg. In an embodiment, the baseplate 100 and the electrically conductive pillars 102 are part of the same continuous metal structure. This continuous metal structure can be created from an initially planar sheet of metal that is processed, e.g., by etching, stamping, etc. In another embodiment, the baseplate 100 and the electrically conductive pillars 102 are separate structures that are attached to one another, e.g., by an adhesive, soldering, etc. In that case, the conductive pillars 102 and the baseplate 100 optionally can be made of different material.

Semiconductor dies 104 are mounted on the baseplate 100. The semiconductor dies 104 are mounted with a main surface 106 of the respective semiconductor die 104 facing away from the baseplate 100. The main surface 106 of the semiconductor dies 104 comprise conductive bond pads (not shown) which form the terminals of the device. A rear surface of the of the semiconductor dies 104 is affixed to the baseplate 100 by a die attach material, e.g., solder, sinter, glue, tape, etc.

The semiconductor dies 104 may have a wide variety of device configurations. According to an embodiment, at least some of the semiconductor dies 104 are configured as power semiconductor devices that are rated to block voltages of at least 100V (volts), and may be on the order of 600V, 1200V or more and/or conduct currents of at least 1 A (volts), and may be on the order of 10 A, 50 A, or more. Examples of power semiconductor devices include MOSFETs (Metal Oxide Semiconductor Field Effect Transistors), IGBTs (Insulated Gate Bipolar Transistors), JFETs (Junction Gate Field Effect Transistors), HEMTs (High Electron Mobility Transistors), bipolar transistors, and diodes. According to an embodiment, at least some of the semiconductor dies 104 are configured as logic devices. Examples of logic devices includes CMOS (complimentary metal oxide semiconductor) based ASIC (application specific integrated circuit) devices and ASSPs (application specific standard products). In an embodiment, the method comprises mounting one semiconductor die 104 that is configured as a power semiconductor device and another semiconductor die 104 that is configured as a logic device together on the same baseplate 100 and forming a semiconductor package that comprises both of these dies.

Vertical interconnect elements 108 are formed on the main surface 106 of the semiconductor dies 104. The vertical interconnect elements 108 are electrically conductive structures that are configured to provide a low-ohmic connection with the bond pads of the semiconductor dies 104. The vertical interconnect elements 108 may comprise a metal such as copper, gold, aluminum, nickel, etc. and alloys thereof. Embodiments of the vertical interconnect elements 108 include conductive pillars, solder bumps or solders balls.

Referring to FIG. 1B, the method comprises forming an encapsulant 110 on the baseplate 100. The encapsulant 110 encapsulates the semiconductor dies 104 and covers the vertical interconnect elements 108 and the electrically conductive pillars 102. The encapsulant 110 comprises an electrically insulating material that is suitable for semiconductor packaging, e.g., mold compound, epoxy, thermosetting plastic, polymer, resin, etc. The encapsulant 110 may be formed by a molding process such as injection molding, transfer molding, compression molding, etc.

According to an embodiment, the encapsulant 110 comprises plateable mold compound. Plateable mold compound refers to a type of semiconductor encapsulation material that includes electrically conductive particles within a matrix of dielectric base material. The electrically conductive particles can be used as seed particles in a metal plating process to deposit metal directly on the encapsulation material. One example of a plateable mold compound is a laser-activatable mold compound. A laser-activatable mold compound refers to a mold compound that includes metal particles, e.g., Cu, Ni, Ag, etc. that are released by a focused laser beam applied to the mold compound, thereby creating an active metal at the surface of the mold compound. This active metal is responsive to a metal plating process, such as electroless plating, such that metal can be deposited directly on the mold compound. In addition to the additive metal ions, a laser-activatable mold compound may include a polymer material as a base material. Examples of these polymers include thermoset polymers having a resin base, ABS (acrylonitrile butadiene styrene), PC/ABS (polycarbonate/acrylonitrile butadiene styrene), PC (polycarbonate), PA/PPA (polyimide/polyphthalamide), PBT (polybutylene terephthalate), COP (cyclic olefin polymer), PPE (polyphenyl ether), LCP (liquid-crystal polymer), PEI (polyethylenimine or polyaziridine), PEEK (polyether ether ketone), PPS (polyphenylene sulfide), etc.

Referring to FIG. 1C, the electrically conductive pillars 102 and the vertical interconnect elements 108 are exposed at an upper surface of the encapsulant 110. According to an embodiment, a trench 112 is formed in the upper surface of the encapsulant 110 that exposes the electrically conductive pillars 102 and the vertical interconnect elements 108. The trench 112 may be formed by etching, polishing, grinding, etc. to remove the encapsulant 110 material that covers the vertical interconnect elements 108 and the electrically conductive pillars 102 such that these elements become exposed. In another embodiment, the electrically conductive pillars 102 and/or the vertical interconnect elements 108 may be exposed by applying a laser to the upper surface of the encapsulant 110. In another embodiment, the vertical interconnect elements 108 and the electrically conductive pillars 102 may be exposed at an upper surface of the encapsulant 110 by appropriately configuring a mold tool cavity which forms the encapsulant 110 to include the trench 112 as a molded feature. That is, the steps of initially covering the vertical interconnect elements 108 and the electrically conductive pillars 102 and then removing encapsulant material may be omitted.

Figures 1D, 1E, 1F:
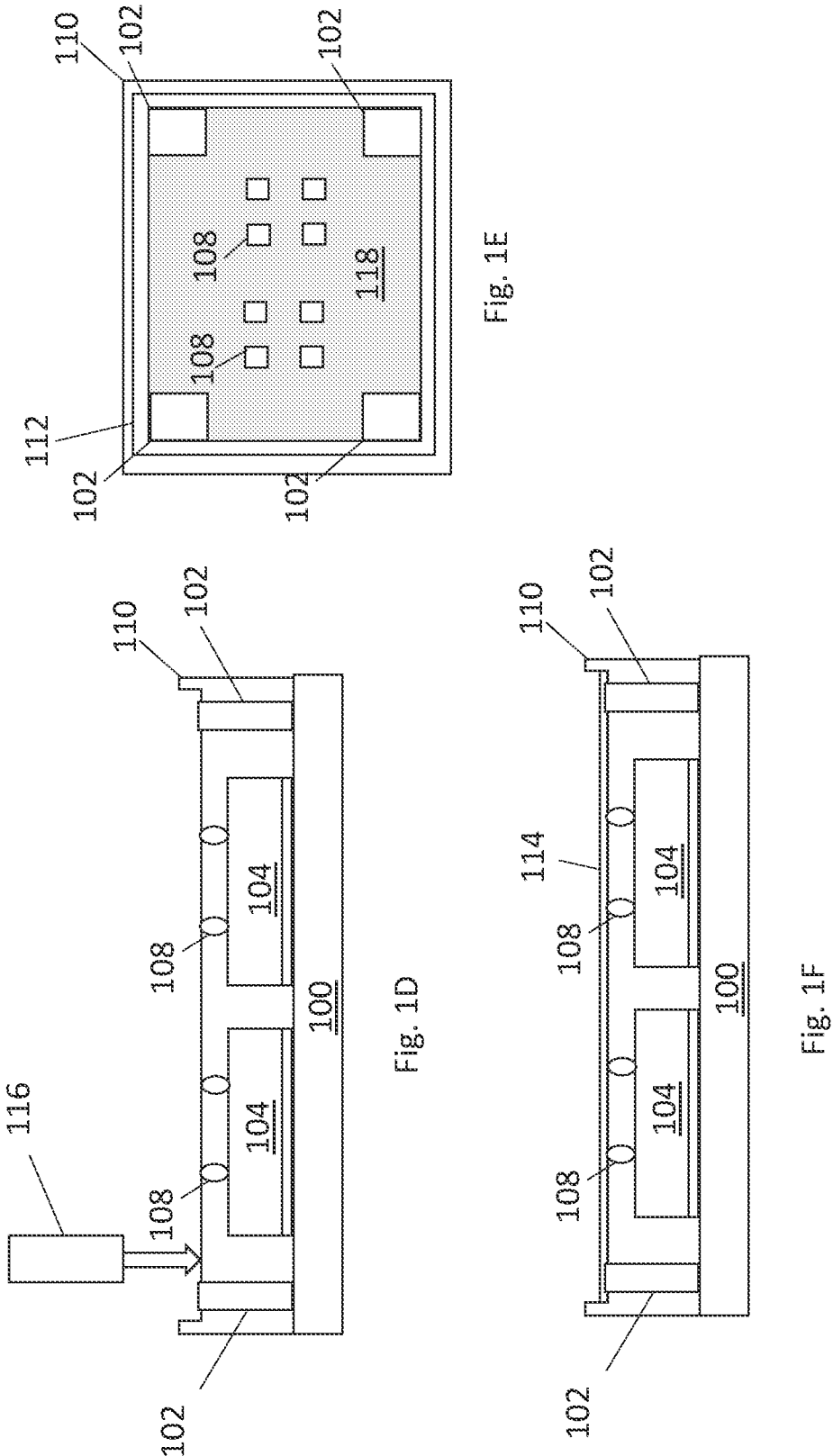

Referring to FIGS. 1D, 1E and 1F, a first level metal pad 114 (shown in FIG. 1F) is formed on the upper surface of the encapsulant 110. The first level metal pad 114 is a continuous metal structure that is formed in an area that overlaps with each of the exposed vertical interconnect elements 108 and each of the exposed electrically conductive pillars 102. Thus, the first level metal pad 114 is formed to contact each of the exposed vertical interconnect elements 108 and each of the exposed electrically conductive pillars 102. The first level metal pad 114 may have a thickness of between 100 nm and 2 μm, for example. According to embodiments, the thickness of the first level metal pad 114 is below 1 μm and may be below 500 nm.

In the depicted embodiment, the first level metal pad 114 is formed by a laser direct structuring process. As shown, in FIGS. 1D-1E, a laser 116 is applied to an area of the encapsulant 110 that overlaps with each of the exposed vertical interconnect elements 108 and each of the exposed electrically conductive pillars 102. The laser 116 forms complexes in the encapsulant 110 that act as a nuclei for a metal plating process, thereby forming a laser-activated portion 118 of the encapsulant 110 as shown in FIG. 1E. Subsequently, the first level metal pad 114 is formed. According to an embodiment, the first level metal pad 114 is formed by an electroless plating process to deposit the first level metal pad 114 on the laser-activated portion 118 of the encapsulant 110. The electroless plating process may comprise submerging the assembly in a chemical bath that contains metal ions (e.g., Cu+ ions, Ni+ ions, Ag+ ions, etc.) that react with the organic metal complexes in the laser-activated portion 118. According to another embodiment, the first level metal pad 114 is formed by another type of metal deposition technique, e.g., sputtering.

Figures 1G, 1H, 1I:
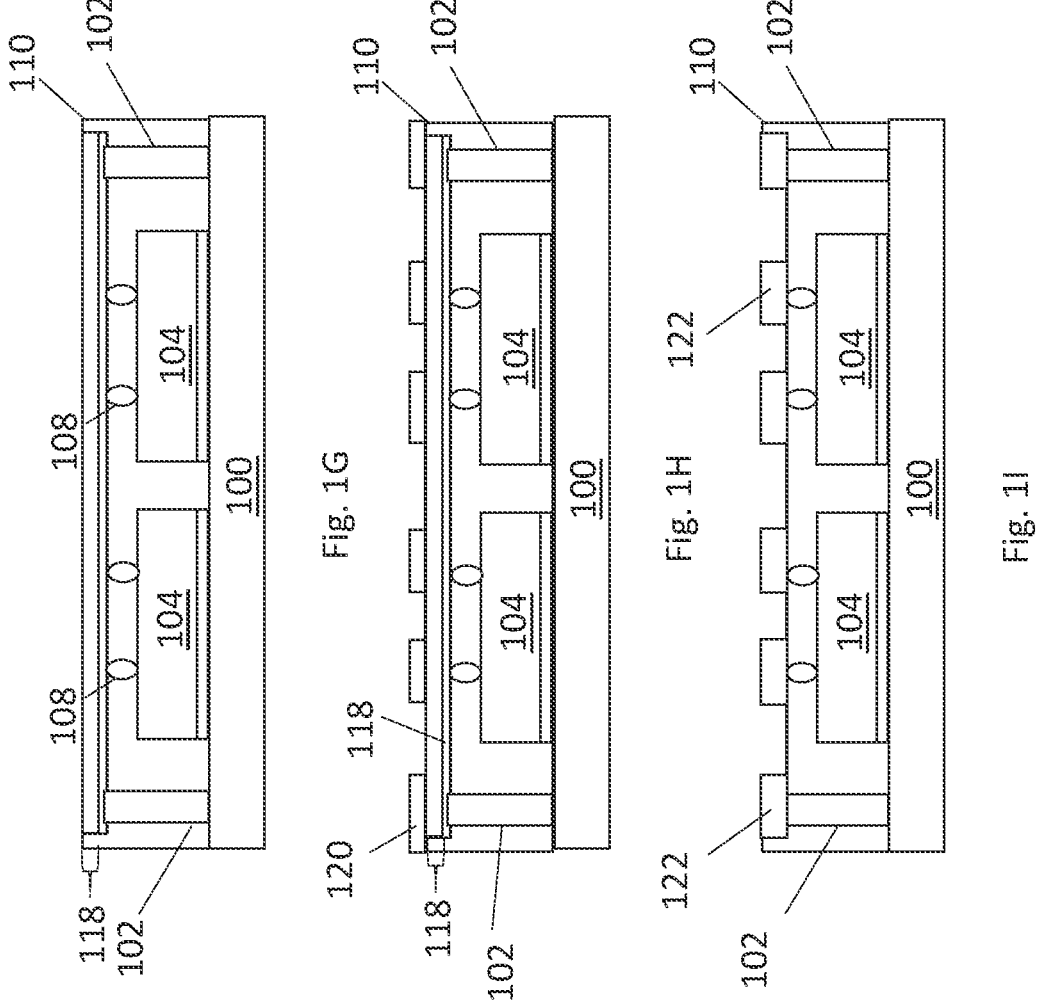

Referring to FIG. 1G, a second level of metal 118 is deposited on the first level metal pad 114. In this embodiment, the second level of metal 118 is formed as a second level metal pad that covers the first level metal pad 114. That is, the second level of metal 118 is a continuous metal structure with an overlapping footprint as the first level metal pad 114. The second level of metal 118 may have a thickness of between 1 µm and 50 µm, for example. According to embodiments, the thickness of the second level of metal 118 is above 5 µm, above 10 µm, above 20 µm, or above 30 µm.

According to an embodiment, the second level of metal 118 is formed by an electrolytic plating process. The electrolytic plating process may use the first level metal pad 114 as a seed layer to form the second level of metal 118 electrolytically thereon. The device may be submerged in chemical bath that contains metal ions (e.g., Cu+ ions, Ni+ ions, Ag+ ions, etc.) and the metal ions are reduced (deposited) onto the first level metal pad 114 through the application of electrical current. The electrical current may be flowed through the first level metal pad 114 via the electrically conductive pillars 102 by using the baseplate 100 as a common cathode terminal. The thickness of the second level of metal 118 may be greater than a thickness of the first level metal pad 114. For example, a ratio between the thickness of the second level of metal 118 and the thickness of the first level metal pad 114 may be between 2:1 and 20:1. Stated in numerical terminals, the first level metal pad 114 may have a thickness of between 500 nm and 1 µm, and the second level of metal 118 have a thickness of between 2 µm and 50 µm, for example.

Referring to FIG. 1H, a patterned film 120 is formed on the second level of metal 118. The patterned film 120 may comprise a photoresist material that is formed by a photolithography technique, e.g., by projecting light through a photomask (not shown) onto the photoresist material and developing the photoresist material to comprise openings that expose selected regions of the underlying metal. The photoresist may either be a positive or negative photoresist, i.e., the exposed photoresist may be soluble to be washed away or insoluble to form the photoresist pattern. According to an embodiment, the patterned film 120 is a dry film photoresist material, meaning that the material is nearly solvent-free and applied as a dry material.

Referring to FIG. 1I, structured metal regions 122 are formed on the upper surface of the encapsulant 110. The structured metal regions 122 comprise structured parts of the first level metal pad 114 and structured parts of the second level of metal 118 that are on top of the first level metal pad 114. The structured metal regions 122 may be formed by an etching process that selectively removes metal that is exposed from the patterned film 120. In this case, a common etching step may be performed to structure the first level metal pad 114 and the second level metal pad corresponding to the second level of metal 118. After forming the structured metal regions 122, the patterned film 120 may be removed, e.g., by a photoresist strip.

Figures 2A, 2B:
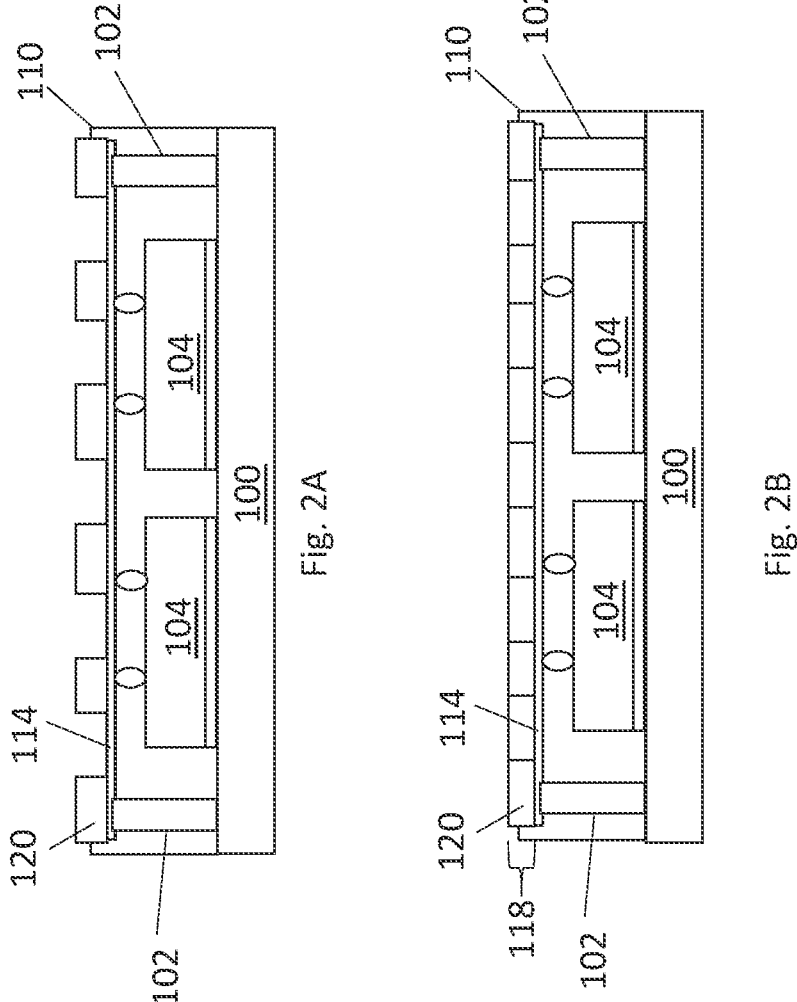
FIGS. 2A-2D, illustrates selected steps in a method of forming a semiconductor package, according to an embodiment.
Figures 2C, 2D:
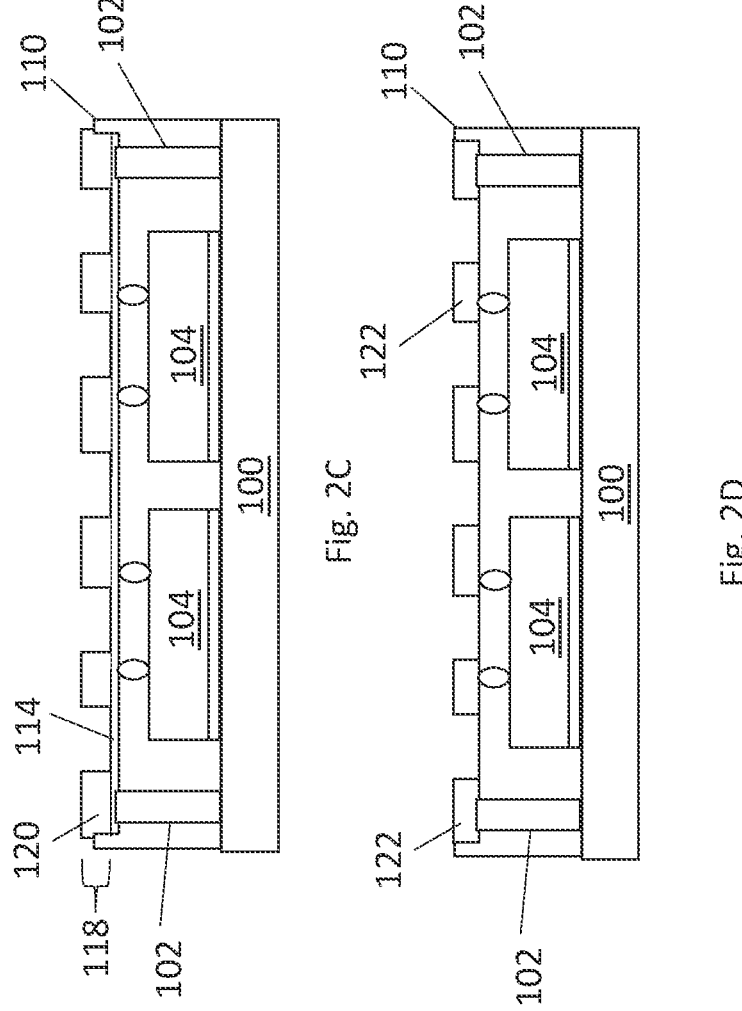

FIG. 2 depicts an alternate technique for forming a semiconductor package to comprise the structured metal regions 122. Each of the method steps described with reference to FIGS. 1A-1F may be performed prior to the step shown in FIG. 1I. FIGS. 2A-2D may replace FIGS. 1G-1I in a method of forming a semiconductor package.

Referring to FIG. 2A, in this embodiment of the method, the patterned film 120 is formed directly on the first level metal pad 114. Thus, in a difference to the embodiment of FIG. 1, the patterned film 120 is formed before forming the second level of metal 118. The patterned film 120 may be formed in the same way as described above.

Referring to FIG. 2B, the method comprises forming the second level of metal 118. The second level of metal 118 may be formed by an electrolytic plating process, e.g., according to the process discussed above. In this embodiment, due to the presence of the patterned film 120 on the first level metal pad 114, the second level of metal 118 forms as second level metal structured regions within openings of the patterned film 120. That is, the patterned film 120 selectively blocks the formation of the second level of metal 118 such that the second level of metal 118 is realized as metal regions that are spaced apart from one another by the patterned film 120.

Referring to FIG. 2C, the method comprises removing the patterned film 120 after depositing the second level of metal 118. This may be done using resist strip techniques such as plasma etching, chemical bath, etc. As a result, the first level metal pad 114 is exposed.

Referring to FIG. 2D, the method comprises forming the structured metal regions 122 on the upper surface of the encapsulant 110. The structured metal regions 122 comprise the second level metal structured regions from the second level of metal 118 and structured portions of the first level metal pad 114. In this case, forming the structured metal regions 122 comprises using the metal regions from the second level of metal 118 as an etch mask to etch the first level metal pad 114. This process may reduce the thickness of the second level of metal 118. The etching process carries the geometry of the second level metal structured regions through into first level metal pad 114.

Figure 3:
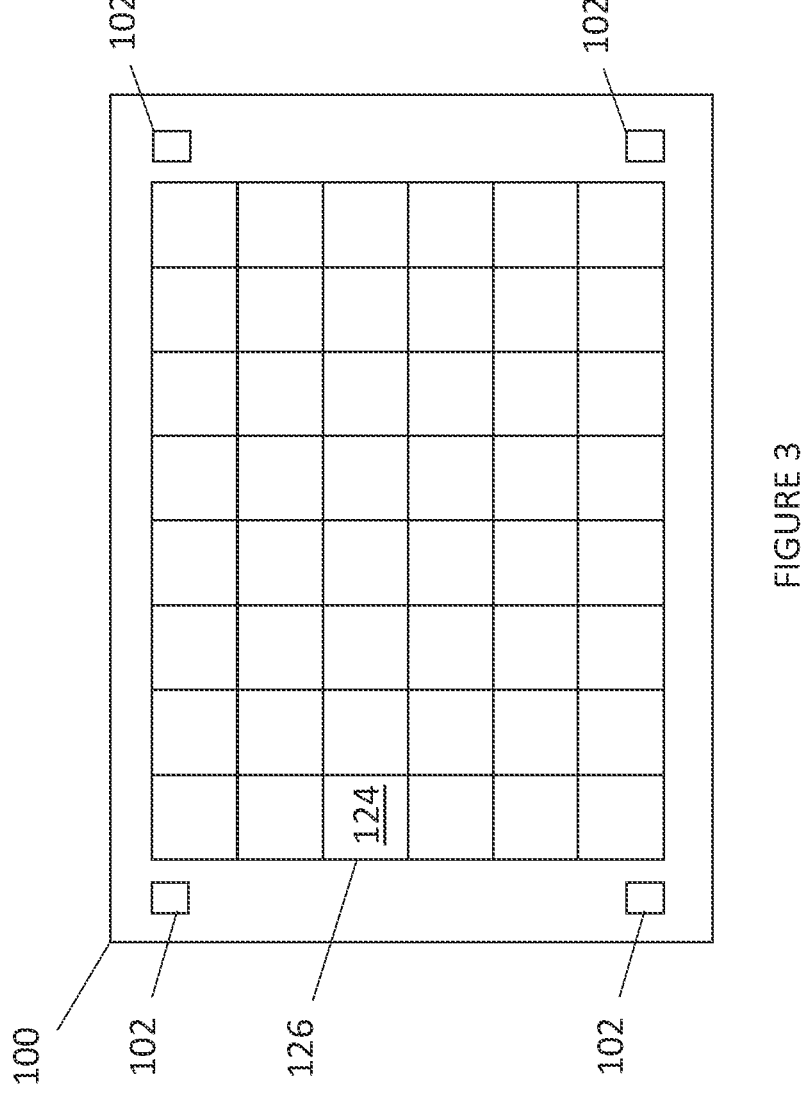
FIG. 3 illustrates a plan-view of a baseplate that may be used in a method of forming a semiconductor package, according to an embodiment.

Referring to FIG. 3, a plan-view of a baseplate 100 is shown, according to an embodiment. The baseplate 100 comprises a plurality of die attach sites 124 within a die attach area 126. The electrically conductive pillars 102 are provided around a periphery of the die attach area 126. That is, the electrically conductive pillars 102 are disposed outside of a two-dimensional area in which any semiconductor die 104 is mounted. In the depicted embodiment, the electrically conductive pillars 102 are disposed in a peripheral region of the baseplate that is between outer edges of the baseplate 100 and the die attach area 126. In other embodiments, the electrically conductive pillars 102 may be disposed between die attach areas 126, i.e., between different groups of die attach sites 124 For example, a baseplate 100 may comprise the arrangement of the die attach area 126 and the electrically conductive pillars 102 repeated multiple times.

A method of forming a plurality of semiconductor packages comprises mounting one of the semiconductor dies 104 within each die attach site 124, forming vertical interconnect elements 108 on the main surface 106 of each of the semiconductor dies 104, forming an encapsulant 110 that encapsulates each of the semiconductor dies 104 and covers the vertical interconnect elements 108 from each of the semiconductor dies 104, exposing the vertical interconnect elements 108 at an upper surface of the encapsulant 110, forming the first level metal pad 114 on the upper surface of the encapsulant 110 that contacts the exposed vertical interconnect elements 108 from each of the semiconductor dies 104, and forming the structured metal regions 122 on the upper surface of the encapsulant 110, wherein the structured metal regions 122 comprise structured portions of the first level metal pad 114, e.g., according to any of the embodiments described with reference to FIGS. 1-2. As can be appreciated from FIG. 3, the first level metal pad 114 can be formed as a continuous pad that extends across each of the semiconductor dies 104 mounted on the baseplate 100. After forming the structured metal regions 122, the encapsulant 110 may be diced to form plurality of semiconductor packages. This may be done using any cutting technique, e.g., mechanical sawing, laser ablation, etc. Optionally, the electrically conductive pillars 102 may be discarded by the package singulation. Alternatively, the electrically conductive pillars 102 may be incorporated into at least some of the singulated packages. For example, the electrically conductive pillars 102 may be used to provide vertical through-via connections. According to an embodiment, the baseplate 100 is removed. This may be done by etching, grinding, etc. The baseplate 100 may be removed at any time after depositing the second level of metal 118 before or after package singulation. In another embodiment, the baseplate 100 remains in the completed package.

Referring to FIG. 4, a semiconductor package 200 that is formed according to the methods disclosed herein is shown, according to an embodiment. In the depicted embodiment, the semiconductor package comprises one of the semiconductor dies 104 and a group of the structured metal regions 122 forming connections with the semiconductor die 104. In other embodiments, the semiconductor package 200 may comprise multiple semiconductor dies 104 packaged together. The structured metal regions 122 may be configured as bond pads that form externally accessible terminals to the semiconductor die 104. Separately or in combination, the structured metal regions 122 may be configured as interconnect tracks that form die-to-die connections in in the case of a multi-die package configuration.

The techniques described herein can advantageously be used to form the structured metal regions 122 to be relatively thick, e.g., at least 5 μm, at least 10 μm, at least 20 μm, at least 50 μm, etc., and hence provide low parasitic electrical resistance. Moreover, these thickness values may be obtained quickly and efficiently, e.g., by performing a sequence of forming the first level metal pad 114 as a thin seed layer and then completing the metal deposition by an electrolytic plating process, which is cable of depositing metal much faster than other types of techniques.

Moreover, the techniques described herein advantageously form the structured metal regions 122 to a high degree of resolution. In particular, the minimum spacing distance $MD_1$ between two immediately adjacent ones of the structured metal regions 122 may be lower than what is attainable in other processing techniques. In this context, the minimum spacing distance $MD_1$ refers to a technology specific manufacturing design rule that dictates how closely two features can be formed. According to an embodiment, the minimum spacing distance $MD_1$ between two immediately adjacent ones of the structured metal regions 122 is less than or equal to two times a thickness of the immediately adjacent ones of the structured metal regions 122. According to an embodiment, the minimum spacing distance $MD_1$ is less than or equal to the thickness of the immediately adjacent ones of the structured metal regions 122. Stated in numerical terms, the minimum spacing distance $MD_1$ between two immediately adjacent ones of the structured metal regions 122 may be in the range of 15 μm to 20 μm for structured metal regions 122 that are 30 μm thick and may be in the range of 25 μm to 35 μm for structured metal regions 122 that are 50 μm thick, and so forth. The above-disclosed spacing to width ratios are not obtainable by techniques that selectively activate a plateable mold compound and deposit metal only on the activated regions, e.g., a laser direct structuring technique that selectively activates a pattern in a laser activatable mold compound and deposits metal selectively on this pattern. In that case, the risk of bridging between the metallization becomes high at low ratios of separation distance and thickness.

The number and arrangement of the semiconductor dies 104, vertical interconnect elements 108 and electrically conductive pillars 102 may differ from what is shown in the figures. The same methods may be applied to arrangements comprising as few as one semiconductor die 104 and two electrically conductive pillars 102, and may be applied to arrangements comprising many more semiconductor dies 104 and/or electrically conductive pillars 102.

The semiconductor package described herein may comprise one or more semiconductor dies with a variety of different configurations. These semiconductor dies may be singulated from a semiconductor wafer (not shown), e.g., by sawing, prior to being mounting on the baseplate. In general, the semiconductor wafer and therefore the resulting semiconductor die may be made of any semiconductor material suitable for manufacturing a semiconductor device. Examples of such materials include, but are not limited to, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), etc. In general, the semiconductor die can be any active or passive electronic component. Examples of these devices include power semiconductor devices, such as power MISFETs (Metal Insulator Semiconductor Field Effect Transistors) power MOSFETs (Metal Oxide Semiconductor Field Effect Transistors), IGBTs (Insulated Gate Bipolar Transistors), JFETs (Junction Gate Field Effect Transistors), HEMTs (High Electron Mobility Transistors), power bipolar transistors or power diodes such as, e.g., PIN diodes or Schottky diodes, etc. Other examples of these devices include logic devices, such as microcontrollers, e.g., memory circuits, level shifters, etc. One or more of the semiconductor dies can be configured as a so-called lateral device. In this configuration, the terminals of the semiconductor die are provided on a single main surface and the semiconductor die is configured to conduct in a direction that is parallel to the main surface of the semiconductor die. Alternatively, one or more of the semiconductor dies can be configured as a so-called vertical device. In this configuration, the terminals of the semiconductor die are provided on opposite facing main and rear surfaces and the semiconductor die is configured to conduct in a direction that is perpendicular to the main surface of the semiconductor die.

Although the present disclosure is not so limited, the following numbered examples demonstrate one or more aspects of the disclosure.

Example 1. A method of forming a semiconductor package, the method comprising: providing a baseplate; mounting a semiconductor die on the baseplate with a main surface of the semiconductor die facing away from the baseplate; forming vertical interconnect elements on the main surface of the semiconductor die; forming an encapsulant on the baseplate that encapsulates the semiconductor die; exposing the vertical interconnect elements at an upper surface of the encapsulant; forming a first level metal pad on the upper surface of the encapsulant that contacts the exposed vertical interconnect elements; and forming structured metal regions on the upper surface of the encapsulant, wherein forming the structured metal regions comprises structuring the first level metal pad.

Example 2. The method of example 1, wherein the encapsulant comprises a laser activatable mold compound, and wherein forming the first level metal pad comprises: laser activating an area on the upper surface of the encapsulant that encloses the vertical interconnect elements; and performing an electroless plating process to deposit the first level metal pad on the laser activated area.

Example 3. The method of example 2, further comprising depositing a second level of metal on the first level metal pad, wherein depositing the second level of metal comprises an electrolytic plating process, and wherein the structured metal regions comprise structured portions of the second level of metal.

Example 4. The method of example 3, wherein the method further comprises: providing electrically conductive pillars on the baseplate before forming the encapsulant; and exposing the electrically conductive pillars at the upper surface of the encapsulant, wherein the first level metal pad is formed to contact the electrically conductive pillars, and wherein the electrolytic plating process is performed by using the electrically conductive pillars to conduct electrical current.

Example 5. The method of example 3, wherein a thickness of the second level of metal is greater than a thickness of the first level metal pad.

Example 6. The method of example 3, wherein depositing the second level of metal on the first level metal pad comprises forming a second level metal pad that covers the first level metal pad, and wherein forming the structured metal regions comprises structuring the first level metal pad and the second level metal pad by a common etching step.

Example 7. The method of example 3, further comprising forming a patterned film directly on the first level metal pad, and wherein depositing the second level of metal comprises forming second level metal structured regions within openings of the patterned film.

Example 8. The method of example 7, further comprising removing the patterned film after depositing the second level of metal, and wherein forming the structured metal regions comprises using the second level metal structured regions as an etch mask to etch the first level metal pad.

Example 9. The method of example 1, wherein exposing the vertical interconnect elements comprises forming a trench in the upper surface of the encapsulant that extends to upper ends of the vertical interconnect elements.

Example 10. The method of example 1, wherein a minimum spacing between two immediately adjacent ones of the structured metal regions is less than or equal to two times a thickness of the immediately adjacent ones of the structured metal regions.

Example 11. The method of example 1, wherein a minimum spacing between two immediately adjacent ones of the structured metal regions is no greater than a thickness of the immediately adjacent ones of the structured metal regions.

Example 12. The method of example 1, further comprising: mounting a second semiconductor die on the baseplate with a main surface of the second semiconductor die facing away from the baseplate; forming vertical interconnect elements on the main surface of the second semiconductor die; forming the encapsulant to encapsulate the second semiconductor die and cover the vertical interconnect elements from the second semiconductor die; and exposing the vertical interconnect elements from the second semiconductor die at the upper surface of the encapsulant, wherein the first level metal pad is formed to contact the exposed vertical interconnect elements from the second semiconductor die at the upper surface of the encapsulant.

Example 13. The method of example 12, wherein one of the structured metal regions forms an electrical connection between the semiconductor die and the second semiconductor die.

Example 14. A method of forming a plurality of semiconductor packages, the method comprising: providing a baseplate; mounting a plurality of semiconductor dies on the baseplate with a main surface of each of the semiconductor dies facing away from the baseplate; forming vertical interconnect elements on the main surfaces of each of the semiconductor dies; forming an encapsulant on the baseplate that encapsulates each of the semiconductor dies; exposing the vertical interconnect elements from each of the semiconductor dies at an upper surface of the encapsulant; forming a first level metal pad on the upper surface of the encapsulant that contacts the exposed vertical interconnect elements from each of the semiconductor dies; and forming structured metal regions on the upper surface of the encapsulant; and dicing the encapsulant to form the plurality of semiconductor packages, wherein each of the semiconductor packages comprises at least one of the semiconductor dies and a group of the structured metal regions forming connections with the at least one of the semiconductor dies, and wherein forming the structured metal regions comprises structuring the first level metal pad.

Example 15. The method of example 14, wherein the encapsulant comprises a laser activatable mold compound, and wherein forming the first level metal pad comprises: laser activating an area on the upper surface of the encapsulant that encloses the vertical interconnect elements; and performing an electroless plating process to deposit the first level metal pad on the laser activated area.

Example 16. The method of example 15, further comprising depositing a second level of metal on the first level metal pad, wherein depositing the second level of metal comprises an electrolytic plating process, and wherein the structured metal regions comprise second level of metal.

Example 17. The method of example 16, wherein the method further comprises: providing electrically conductive pillars on the baseplate before forming the encapsulant; and exposing the electrically conductive pillars at the upper surface of the encapsulant, wherein the first level metal pad is formed to contact the electrically conductive pillars, and wherein the electrolytic plating process is performed by using the electrically conductive pillars to conduct electrical current.

Example 18. The method of example 17, wherein the encapsulant is diced such that the semiconductor packages are devoid of the electrically conductive pillars.

Example 19. The method of example 17, wherein each of the electrically conductive pillars provided around a periphery of a die attach area, and wherein each of the semiconductor dies from the plurality is mounted within die attach area.

Example 20. The method of example 16, further comprising removing the baseplate after depositing the second level of metal.

Spatially relative terms such as "under," "below," "lower," "over," "upper," "main", "rear", and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of forming a semiconductor package, the method comprising:

providing a baseplate;

providing a semiconductor die that comprises a plurality of vertical interconnect elements on a main surface of the semiconductor die;

mounting the semiconductor die on the baseplate with the main surface of the semiconductor die facing away from the baseplate;

forming an encapsulant on the baseplate that encapsulates the semiconductor die;

exposing the vertical interconnect elements at an upper surface of the encapsulant;

forming a first level metal pad on the upper surface of the encapsulant that contacts each of the exposed vertical interconnect elements; and forming structured metal regions on the upper surface of the encapsulant from the first level metal pad, wherein the method further comprises:

providing electrically conductive pillars on the baseplate before forming the encapsulant;

exposing the electrically conductive pillars at the upper surface of the encapsulant; and performing an electrolytic plating process by using the electrically conductive pillars to conduct electrical current, wherein the first level metal pad is formed to contact the electrically conductive pillars.

2. The method of claim 1, wherein the encapsulant comprises a laser activatable mold compound, and wherein forming the first level metal pad comprises:

laser activating an area on the upper surface of the encapsulant that encloses the vertical interconnect elements; and performing an electroless plating process to deposit the first level metal pad on the laser activated area.

3. The method of claim 2, further comprising depositing a second level of metal on the first level metal pad, wherein depositing the second level of metal comprises the electrolytic plating process, and wherein the structured metal regions comprise structured portions of the second level of metal.

4. The method of claim 3, wherein a thickness of the second level of metal is greater than a thickness of the first level metal pad.

5. The method of claim 3, wherein depositing the second level of metal on the first level metal pad comprises forming a second level metal pad that covers the first level metal pad, and wherein forming the structured metal regions comprises structuring the first level metal pad and the second level metal pad by a common etching step.

6. The method of claim 3, further comprising forming a patterned film directly on the first level metal pad, and wherein depositing the second level of metal comprises forming second level metal structured regions within openings of the patterned film.

7. The method of claim 6, further comprising removing the patterned film after depositing the second level of metal, and wherein forming the structured metal regions comprises using the second level metal structured regions as an etch mask to etch the first level metal pad.

8. The method of claim 1, wherein exposing the vertical interconnect elements comprises forming a trench in the upper surface of the encapsulant that extends to upper ends of the vertical interconnect elements.

9. The method of claim 1, wherein a minimum spacing between two immediately adjacent ones of the structured metal regions is less than or equal to two times a thickness of the immediately adjacent ones of the structured metal regions.

10. The method of claim 1, wherein a minimum spacing between two immediately adjacent ones of the structured metal regions is no greater than a thickness of the immediately adjacent ones of the structured metal regions.

11. The method of claim 1, further comprising:

mounting a second semiconductor die on the baseplate with a main surface of the second semiconductor die facing away from the baseplate;

forming vertical interconnect elements on the main surface of the second semiconductor die;

forming the encapsulant to encapsulate the second semiconductor die and cover the vertical interconnect elements from the second semiconductor die; and exposing the vertical interconnect elements from the second semiconductor die at the upper surface of the encapsulant, wherein the first level metal pad is formed to contact the exposed vertical interconnect elements from the second semiconductor die at the upper surface of the encapsulant.

12. The method of claim 11, wherein one of the structured metal regions forms an electrical connection between the semiconductor die and the second semiconductor die.

13. A method of forming a plurality of semiconductor packages, the method comprising:

providing a baseplate;

providing a plurality of semiconductor dies, each comprising a plurality of vertical interconnect elements on a main surface of the respective semiconductor die;

mounting the plurality of semiconductor dies on the baseplate with the main surface of each of the semiconductor dies facing away from the baseplate;

forming an encapsulant on the baseplate that encapsulates each of the semiconductor dies;

exposing the vertical interconnect elements from each of the semiconductor dies at an upper surface of the encapsulant;

forming a first level metal pad on the upper surface of the encapsulant that contacts each of the exposed vertical interconnect elements from each of the semiconductor dies;

forming structured metal regions on the upper surface of the encapsulant; and dicing the encapsulant to form the plurality of semiconductor packages, wherein each of the semiconductor packages comprises at least one of the semiconductor dies and a group of the structured metal regions forming connections with the at least one of the semiconductor dies, wherein forming the structured metal regions comprises structuring the first level metal pad, and wherein the method further comprises:

providing electrically conductive pillars on the baseplate before forming the encapsulant;

exposing the electrically conductive pillars at the upper surface of the encapsulant; and performing an electrolytic plating process by using the electrically conductive pillars to conduct electrical current, wherein the first level metal pad is formed to contact the electrically conductive pillars.

14. The method of claim 13, wherein the encapsulant comprises a laser activatable mold compound, and wherein forming the first level metal pad comprises:

laser activating an area on the upper surface of the encapsulant that encloses the vertical interconnect elements; and performing an electroless plating process to deposit the first level metal pad on the laser activated area.

15. The method of claim 14, further comprising depositing a second level of metal on the first level metal pad, wherein depositing the second level of metal comprises the electrolytic plating process, and wherein the structured metal regions comprise second level of metal.

16. The method of claim 15, further comprising removing the baseplate after depositing the second level of metal.

17. The method of claim 13, wherein the encapsulant is diced such that the semiconductor packages are devoid of the electrically conductive pillars.

18. The method of claim 13, wherein each of the electrically conductive pillars provided around a periphery of a die attach area, and wherein each of the semiconductor dies from the plurality is mounted within die attach area.

* * * * *